(12) United States Patent
Takahashi et al.

(10) Patent No.: US 11,602,050 B2
(45) Date of Patent: Mar. 7, 2023

(54) FLEXIBLE PRINTED CIRCUIT BOARD AND WIRING MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Hideo Takahashi, Mie (JP); Shinichi Takase, Mie (JP); Hideaki Nakajima, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 17/275,908

(22) PCT Filed: Sep. 11, 2019

(86) PCT No.: PCT/JP2019/035664
§ 371 (c)(1),
(2) Date: Mar. 12, 2021

(87) PCT Pub. No.: WO2020/071069
PCT Pub. Date: Apr. 9, 2020

(65) Prior Publication Data
US 2021/0267057 A1   Aug. 26, 2021

(30) Foreign Application Priority Data
Oct. 2, 2018   (JP) .............................. JP2018-187562

(51) Int. Cl.
*H05K 1/11*   (2006.01)
*H05K 1/18*   (2006.01)
(Continued)

(52) U.S. Cl.
CPC .......... *H05K 1/118* (2013.01); *H01M 50/209* (2021.01); *H01M 50/50* (2021.01);
(Continued)

(58) Field of Classification Search
CPC ........ H05K 1/118; H05K 1/028; H05K 1/189; H05K 2201/0154; H05K 2201/052;
(Continued)

(56) References Cited

U.S. PATENT DOCUMENTS 9,024,572 B2   5/2015   Nishihara et al.
11,063,322 B2 *   7/2021   Ota ........................ H01R 12/77
(Continued)

FOREIGN PATENT DOCUMENTS

JP   2011-228216   11/2011
JP   2012-506108   3/2012
(Continued)

OTHER PUBLICATIONS

English Translation of Suzuki (JP2012190678A) provided with Office Action (Year: 2012).*
(Continued)

*Primary Examiner* — Roshn K Varghese
(74) *Attorney, Agent, or Firm* — Greenblum & Bernstein, P.L.C.

(57) ABSTRACT

A flexible printed circuit board includes: a proximal end portion; a left strip portion and a right strip portion that extend in the rear direction from the proximal end portion; and conductive paths, a portion of which is provided spanning from the proximal end portion to the left strip portion, and another portion of which is provided spanning from the
(Continued)

proximal end portion to the right strip portion. In portions of the conductive path in the left strip portion and the right strip portion, strip side connecting portions that are electrically connected to electrode terminals of electricity storage devices are provided. In the left strip portion, a deformation portion that deforms to increase the distance between the left strip portion and the right strip portion is provided.

11 Claims, 14 Drawing Sheets

(51) Int. Cl.
*H01M 50/502* (2021.01)
*H05K 1/02* (2006.01)
*H01M 50/50* (2021.01)
*H01M 50/209* (2021.01)

(52) U.S. Cl.
CPC .......... *H01M 50/502* (2021.01); *H05K 1/028* (2013.01); *H05K 1/189* (2013.01)

(58) Field of Classification Search
CPC ....... H05K 2201/053; H05K 2201/055; H05K 2201/10189; H05K 2201/10272; H01M 50/502; H01M 50/519; H01M 50/507; Y02E 60/10
See application file for complete search history.

(56) References Cited

U.S. PATENT DOCUMENTS

| | | | |
|---|---|---|---|
| 2010/0155109 A1* | 6/2010 | Takahashi | H05K 3/4691 |
| | | | 174/254 |
| 2011/0262777 A1 | 10/2011 | Choi et al. | |
| 2012/0231638 A1 | 9/2012 | Ikeda et al. | |
| 2017/0271642 A1 | 9/2017 | Groshert et al. | |

FOREIGN PATENT DOCUMENTS

| | | | |
|---|---|---|---|
| JP | 2012190678 A | * | 10/2012 |
| JP | 5621765 | | 11/2014 |
| JP | 2019-129055 | | 8/2019 |

OTHER PUBLICATIONS

Official Communication issued in International Bureau of WIPO Patent Application No. PCT/JP2019/035664, dated Nov. 26, 2019, along with an English translation thereof.

* cited by examiner

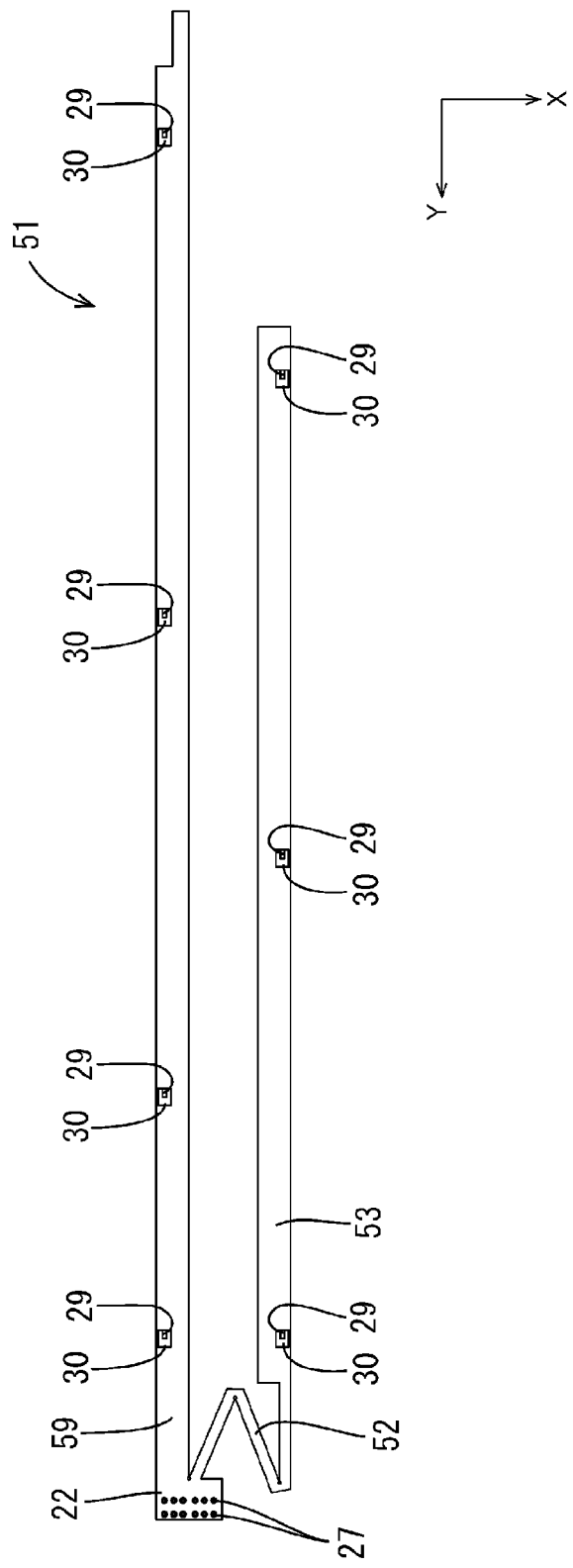

FLEXIBLE PRINTED CIRCUIT BOARD AND WIRING MODULE

TECHNICAL FIELD

A technique disclosed in this specification relates to a flexible printed circuit board and a wiring module in which the flexible printed circuit board is used.

BACKGROUND ART

Conventionally, as a wiring module that is attached to a battery block in which a plurality of batteries that have electrode terminals are arranged, a wiring module disclosed in Patent Document 1 (Japanese Patent No. 5621765) is known. On the upper surface of a battery that has a substantially parallelepiped shape, a pair of electrode terminals protruding upward are provided at positions close to opposite end portions. As a result of a plurality of batteries being arranged, the electrode terminals constitute a first terminal row and a second terminal row.

On the upper surface of the battery block, a first flexible printed circuit board that is connected to the first terminal row and a second flexible printed circuit board that is connected to the second terminal row are disposed. The first flexible printed circuit board and the second flexible printed circuit board each include a voltage detection circuit for detecting the voltage between battery terminals.

CITATION LIST

Patent Document

Patent Document 1: Japanese Patent No. 5621765

SUMMARY OF INVENTION

Technical Problem

The configuration described above requires two flexible printed circuit boards, which increases the number of components and the production cost.

On the other hand, as shown in FIG. 50 of Patent Document 1, in the case where one wide flexible printed circuit board is used to detect a voltage between the first terminal row and the second terminal row, a wasted space in which a circuit is not formed is created in the flexible printed circuit board as schematically shown in FIG. 1 of Patent Document 1. This is because the number of circuits connected to the electrode terminals decreases gradually in the lengthwise direction of the flexible printed circuit board. When such a wasted space is created in the flexible printed circuit board, the production cost increases.

The technique disclosed in the specification of the present application has been accomplished based on the circumstances described above, and it is an object of the present application to provide a technique for a wiring module with a reduced production cost.

Solution to Problem

The technique disclosed in the specification of the present application relates to a flexible printed circuit board including: a proximal end portion; two strip portions that extend in a first direction from the proximal end portion; and conductive paths that are provided spanning from the proximal end portion to each of the two strip portions and that include strip side connecting portions that are electrically connected to electrode terminals of electricity storage devices at portions of the conductive paths in the two strip portions, wherein, in at least one strip portion of the two strip portions, a deformation portion is provided that deforms to increase a distance between the one strip portion and the other strip portion in a second direction that intersects the first direction.

Also, the technique disclosed in the specification of the present application relates to a wiring module including: the flexible printed circuit board described above; and a plurality of conductive members that are connected to the electrode terminals of the plurality of electricity storage devices that include the electrode terminals and are connected to the strip side connecting portions, wherein the plurality of conductive members are spaced apart in the first direction and connected to the strip side connecting portions provided in the two strip portions of the flexible printed circuit board.

With the configuration described above, the wiring module can be formed using one flexible printed circuit board, and thus the number of components can be reduced. Accordingly, the production cost can be reduced.

Also, because the proximal end portion and the conductive paths spanning from the proximal end portion to each of the two strip portions are formed, there is no need to provide a wasted space in which a conductive path is not formed in a region between the two strip portions. Accordingly, the production cost can be reduced.

Also, with the configuration described above, by changing the degree of deformation of the deformation portion, the distance between the one strip portion and the other strip portion can be changed as appropriate. Thus, even if the interval between electrode terminals is different, by changing the degree of deformation of the deformation portion, this problem can be easily dealt with by simply using the flexible printed circuit board that has one shape. As a result, the production cost can be reduced as compared with the case where flexible printed circuit boards are formed individually according to the interval between electrode terminals.

Preferred aspects of the technique disclosed in the specification of the present application are listed below.

Proximal end-side connecting portions that are connected to a connector are provided at portions of the conductive paths in the proximal end portion.

With the configuration described above, the number of components can be reduced as compared with the case where the connector is provided in each of the two strip portions, and thus the production cost can be reduced.

The distance between the one strip portion and the other strip portion is increased as a result of the deformation portion being bent.

With the configuration described above, with a simple method of bending the deformation portion, the distance between the two strip portions can be increased, and it is therefore possible to suppress an increase in the production cost.

A notch portion is formed in at least one side edge of the one strip portion that includes the deformation portion, and the deformation portion is bent at the notch portion.

With the configuration described above, a worker can easily bend the strip portion when bending the deformation portion, and it is therefore possible to improve the efficiency of bending the deformation portion.

At least one slit that extends in the first direction is formed in the one strip portion that includes the deformation portion, and the distance between the one strip portion and the other strip portion is increased as a result of the deformation portion being deformed to widen the at least one slit.

With the configuration described above, with a simple method of deforming the strip portion to widen the slit, the distance between the two strip portions can be increased, and it is therefore possible to suppress an increase in the production cost.

A via hole that has a diameter larger than a width dimension of the slit is formed in an end portion of the slit.

With the configuration described above, due to the via hole, the slit can be easily deformed, and it is therefore possible to improve the working efficiency of deforming the deformation portion to be spaced apart.

Advantageous Effects of Invention

With the technique disclosed in the specification of the present application, the production cost of the wiring module can be reduced.

BRIEF DESCRIPTION OF DRAWINGS

FIG. 14 is a plan view showing the flexible printed circuit board in a state in which the deformation portion is deformed.

DESCRIPTION OF EMBODIMENTS

Embodiment 1

Figure 1:
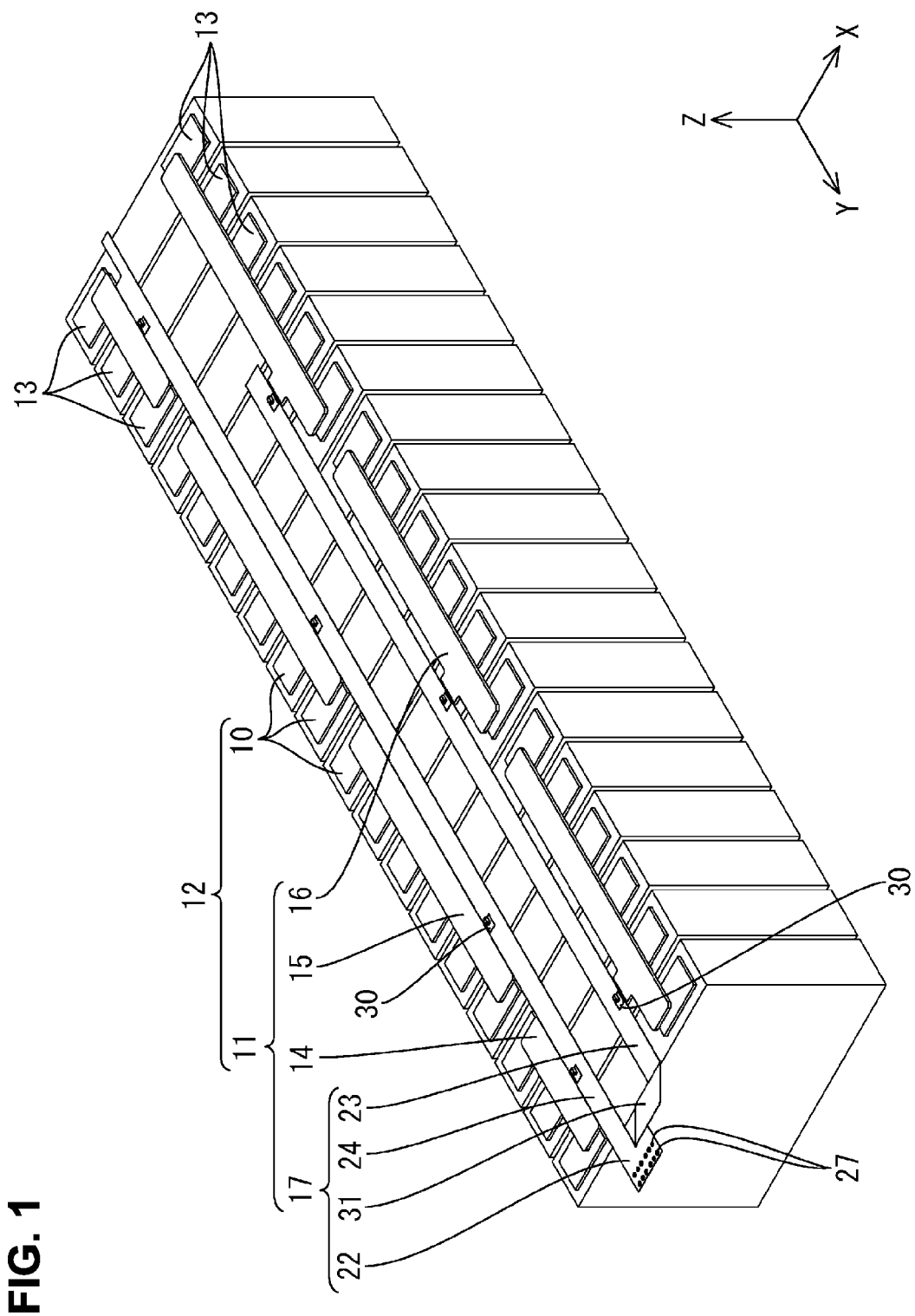
FIG. 1 is a perspective view showing an electricity storage module according to Embodiment 1.

A description will be given of Embodiment 1 in which the technique disclosed in the specification of the present application is applied to a wiring module 11 that is attached to a plurality of electricity storage devices 10, with reference to FIGS. 1 to 10. An electricity storage module 12 in which the wiring module 11 is attached to the plurality of electricity storage devices 10 is mounted on a vehicle (not shown) such as an electric vehicle or a hybrid automobile, and used as the driving source for the vehicle and the power source for electric devices mounted on the vehicle. In the description given below, the Z direction indicates the upper direction, the Y direction indicates the front direction, and the X direction indicates the left direction. Also, for a plurality of members that are the same, reference numerals are given only to a portion of the plurality of members, and reference numerals of the other members may be omitted.

Electricity Storage Device 10

Figure 2:
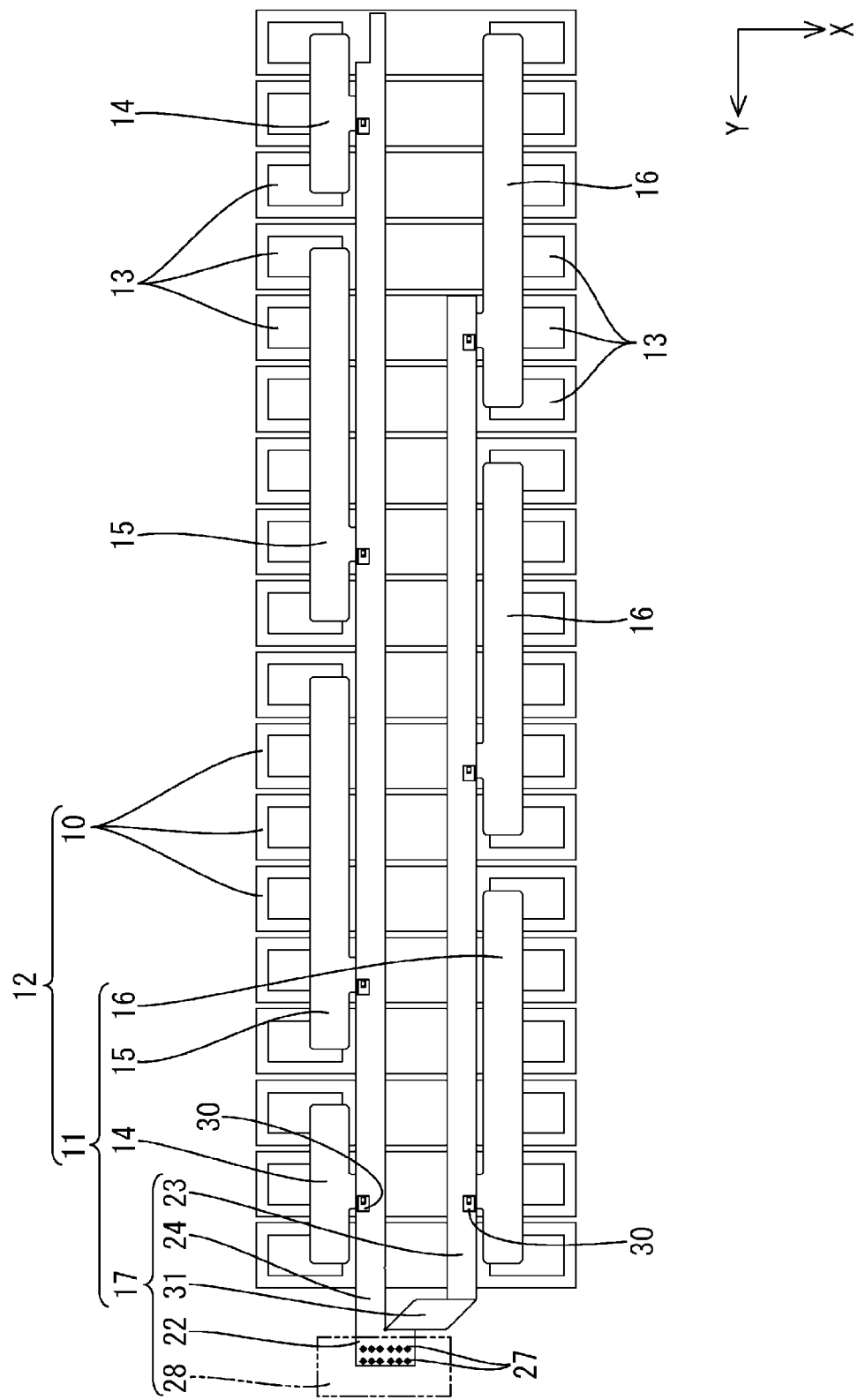
FIG. 2 is a plan view of the electricity storage module.

As shown in FIGS. 1 and 2, each electricity storage device 10 has, overall, a flat parallelepiped shape extending in the front-rear direction (an example of a first direction). The electricity storage device 10 houses an electricity storage element (not shown). On the upper surface of the electricity storage device 10, electrode terminals 13 are provided at positions close to opposite end portions in the left-right direction (an example of a second direction). The electrode terminals 13 each have a substantially elongated rectangular shape extending in the left-right direction when viewed from above. One of the electrode terminals 13 serves as the positive electrode, and the other electrode terminal 13 serves as the negative electrode. A plurality of (eighteen in the present embodiment) electricity storage devices 10 are arranged in the front-rear direction.

Wiring Module 11

As shown in FIG. 2, the wiring module 11 includes a plurality of (two in the present embodiment) first bus bars 14 (an example of a conductive member), a plurality of (two in the present embodiment) second bus bars 15 (an example of a conductive member), a plurality of (three in the present embodiment) third bus bars 16 (an example of a conductive member) that are connected to the electrode terminals 13, and a flexible printed circuit board 17 to which the first bus bars 14, the second bus bars 15, and the third bus bars 16 are connected.

First Bus Bar 14

Figure 3:
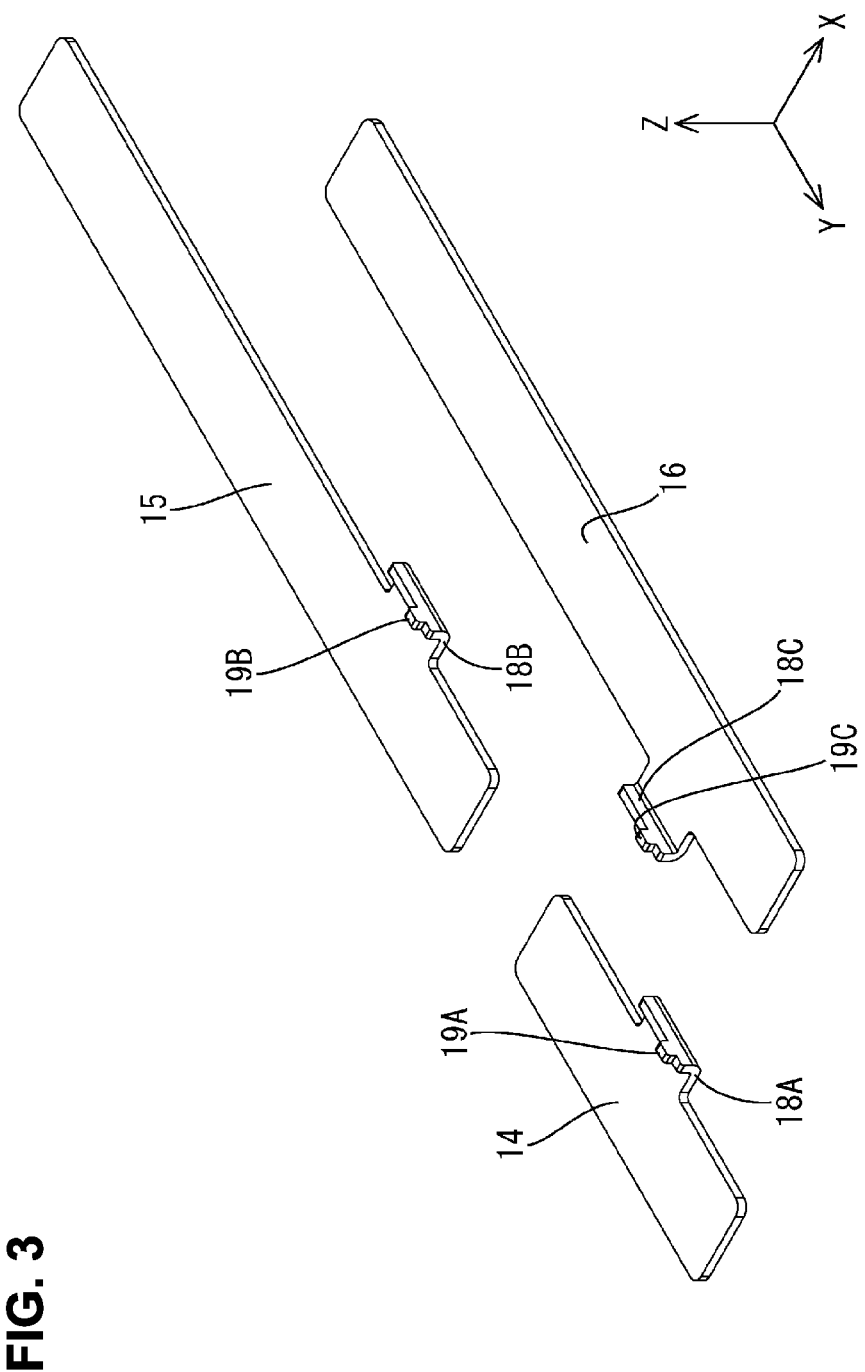
FIG. 3 is a perspective view showing a first bus bar, a second bus bar, and a third bus bar.
Figure 4:
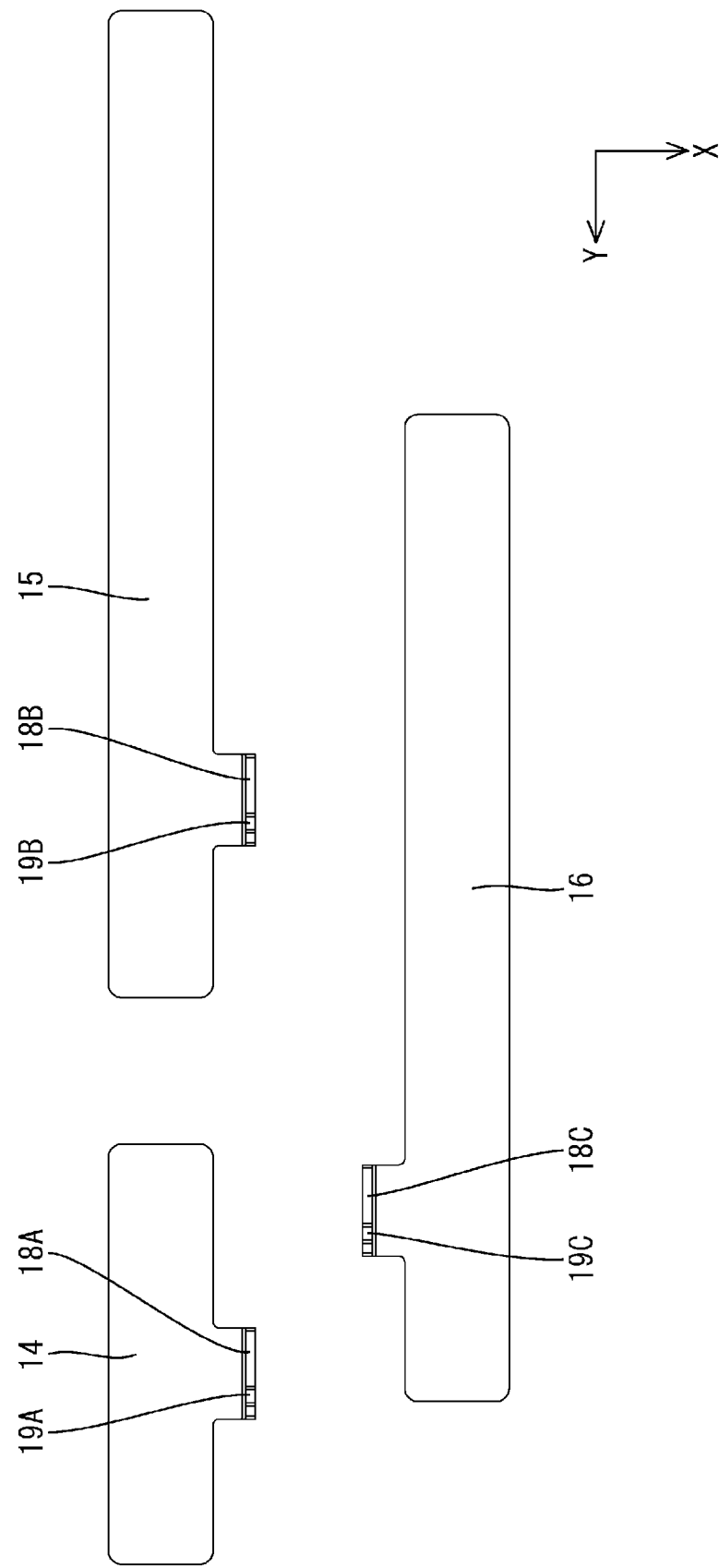
FIG. 4 is a plan view of the first bus bar, the second bus bar, and the third bus bar.

As shown in FIGS. 3 and 4, each first bus bar 14 is formed by pressing a metal plate member into a predetermined shape. As the metal that constitutes the first bus bar 14, any metal can be selected such as copper, a copper alloy, aluminum, or an aluminum alloy. The surface of the first bus bar 14 may be plated with a plating layer of tin, nickel, or the like.

The first bus bar 14 has, overall, an elongated rectangular shape extending in the front-rear direction when viewed from above. The length dimension in the front-rear direction of the first bus bar 14 is set to be slightly smaller than the total length dimension in the front-rear direction of three adjacent electrode terminals 13 that are provided on three electricity storage devices 10 arranged in the front-rear direction. With this configuration, the first bus bar 14 can be mounted on three electrode terminals 13 that are adjacent in the front-rear direction.

The first bus bar 14 is mounted on three electrode terminals 13 that are adjacent in the front-rear direction and connected to the electrode terminals 13 using a known method such as laser welding or soldering in this state. Three electrode terminals 13 of the same polarity are connected to the first bus bar 14. With this configuration, three electricity storage devices 10 that are arranged in the front-rear direction are connected in parallel.

In one of a pair of long sides of the first bus bar 14 (the left side in the present embodiment), an extension portion 18A that protrudes toward the left and is bent upward is provided in the vicinity of the center of the long side in the front-rear direction. In the upper end portion of the extension portion 18A, a protruding portion 19A that protrudes upward is provided at a position located slightly rearward from the front end portion of the extension portion 18A. The length dimension in the front-rear direction of the protruding portion 19A is substantially one fifth of the length dimension in the front-rear direction of the extension portion 18A. The protruding height dimension of the protruding portion 19A from the upper end portion of the extension portion 18A is set to be slightly larger than the thickness dimension of the flexible printed circuit board 17.

Second Bus Bar 15

Each second bus bar 15 has, overall, an elongated rectangular shape extending in the front-rear direction when viewed from above. The length dimension in the front-rear direction of the second bus bar 15 is set to be slightly smaller than the total length dimension in the front-rear direction of six adjacent electrode terminals 13 of six electricity storage devices 10 arranged in the front-rear direction. With this configuration, the second third bus bar 15 can be mounted on six electrode terminals 13 that are adjacent in the front-rear direction.

The second bus bar 15 is mounted on six electrode terminals 13 that are adjacent in the front-rear direction and connected to the electrode terminals 13 using a known method such as laser welding or soldering in that state. Out of the six electrode terminals 13 that are connected to the second bus bar 15, the polarity of three electrode terminals 13 on the front side and the polarity of three electrode terminals 13 on the rear side are different. With this configuration, the three electricity storage devices 10 on the front side that are connected in parallel and the three electricity storage devices 10 on the rear side that are connected in parallel are connected in series.

In one of a pair of long sides of the second bus bar 15 (the left side in the present embodiment), an extension portion 18B that protrudes toward the left and is bent upward is provided at a position close to the front end portion of the long side. In the upper end portion of the extension portion 18B, a protruding portion 19B that protrudes upward is provided at a position located slightly rearward from the front end portion of the extension portion 18B.

The second bus bar 15 has the same configuration as that of the first bus bar 14 except for the above, and thus a redundant description will be omitted.

Third Bus Bar 16

Each third bus bar 16 has, overall, an elongated rectangular shape extending in the front-rear direction when viewed from above. The length dimension in the front-rear direction of the third bus bar 16 is set to be slightly smaller than the total length dimension in the front-rear direction of six adjacent electrode terminals 13 of six electricity storage devices 10 that are arranged in the front-rear direction. With this configuration, the third bus bar 16 can be mounted on six electrode terminals 13 that are adjacent in the front-rear direction.

The third bus bar 16 is mounted on six electrode terminals 13 that are adjacent in the front-rear direction and connected to the electrode terminals 13 using a known method such as laser welding or soldering in that state. Out of the six electrode terminals 13 that are connected to the third bus bar 16, the polarity of three electrode terminals 13 on the front side and the polarity of three electrode terminals 13 on the rear side are different. With this configuration, the three electricity storage devices 10 on the front side that are connected in parallel and the three electricity storage devices 10 on the rear side that are connected in parallel are connected in series.

In one of a pair of long sides of the third bus bar 16 (the right side in the present embodiment), an extension portion 18C that protrudes toward the right and is bent upward is provided at a position close to the front end portion of the long side. In the upper end portion of the extension portion 18C, a protruding portion 19C that protrudes upward is provided at a position located slightly rearward from the front end portion of the extension portion 18C.

The third bus bar 16 has the same configuration as that of the first bus bar 14 except for the above, and thus a redundant description will be omitted.

Flexible Printed Circuit Board 17

Figure 8:
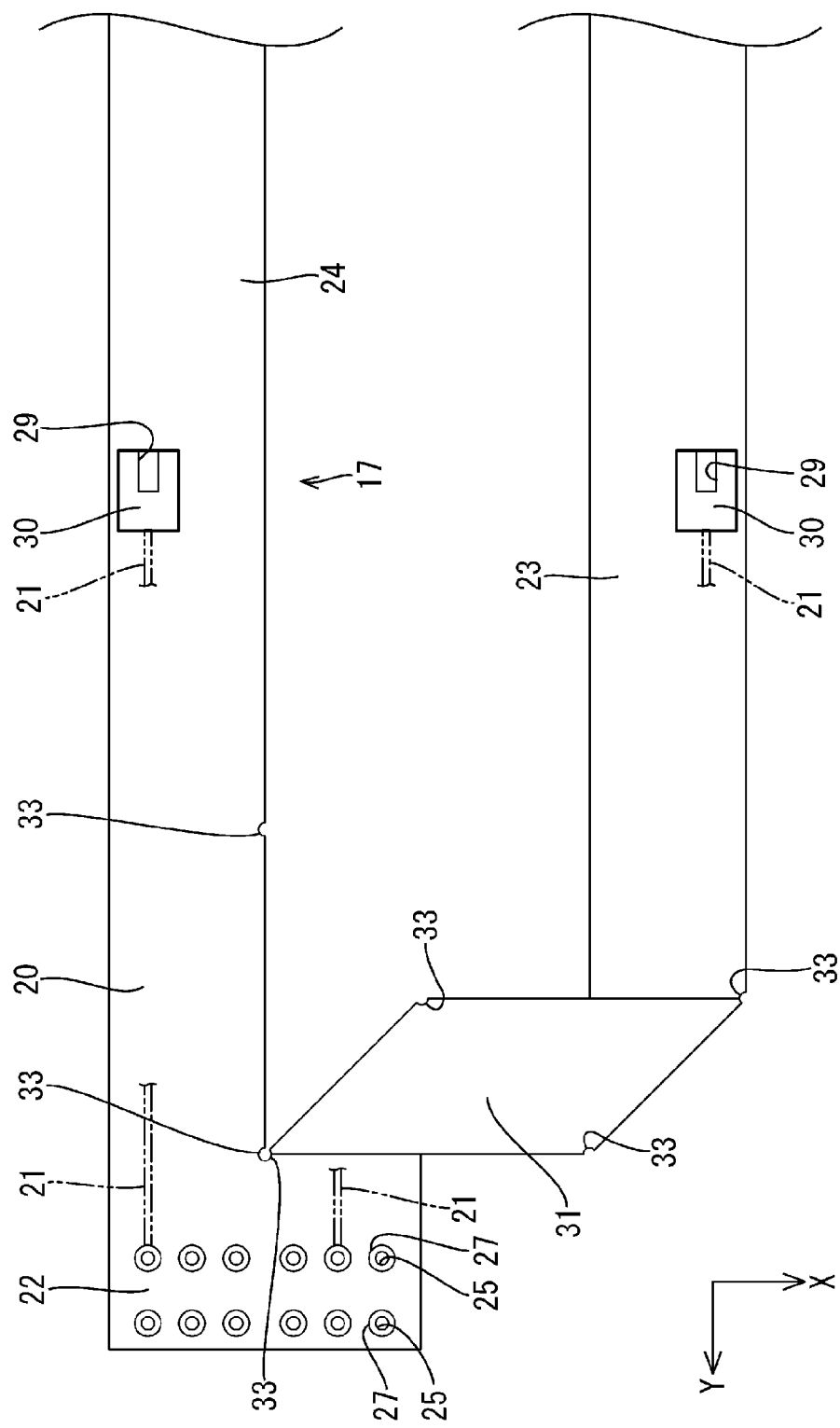
FIG. 8 is a partially enlarged plan view showing the flexible printed circuit board in a state in which the deformation portion is bent.

As shown in FIG. 8, the flexible printed circuit board 17 according to the present embodiment has a plurality of conductive paths 21 that are formed on the upper surface of a film 20 made of an insulating synthetic resin using printed circuit board technology. As the insulating synthetic resin, a known material such as polyimide can be selected. The flexible printed circuit board 17 is flexible and deformable, and can be bent and deformed. Additional conductive paths may be further formed on the underside of the flexible printed circuit board 17.

Figure 5:
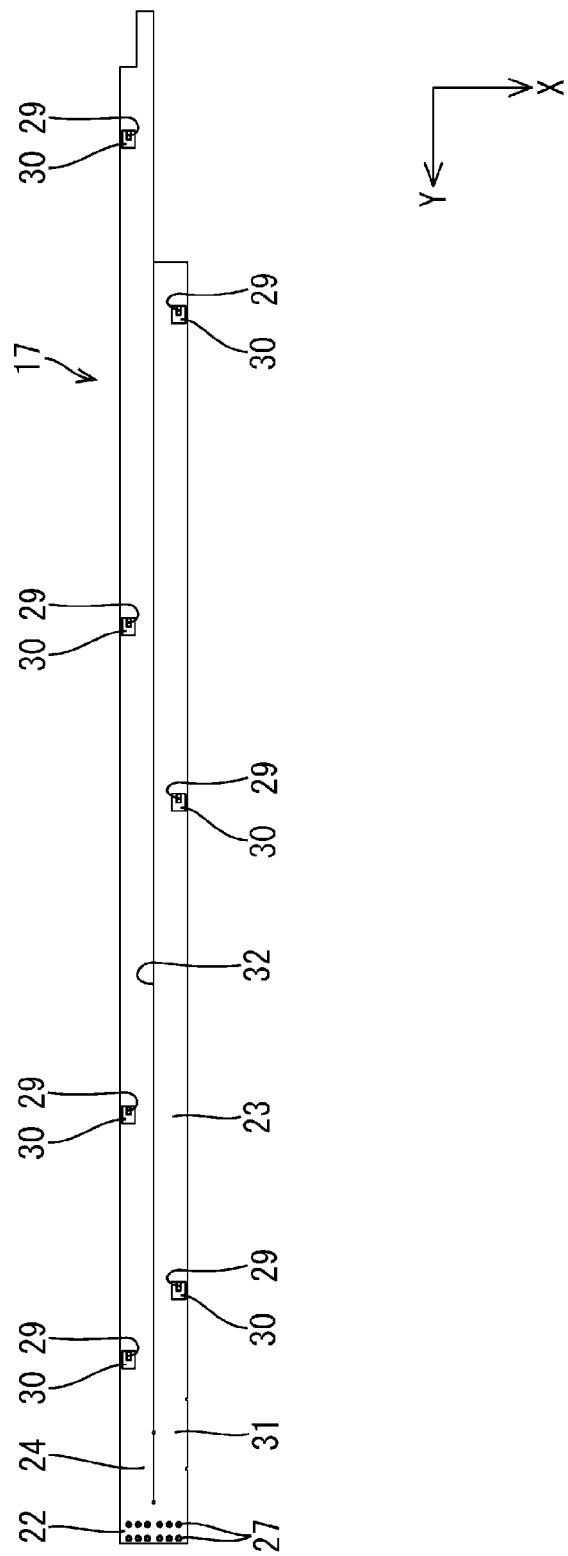
FIG. 5 is a plan view showing a flexible printed circuit board in a state in which a deformation portion is not bent.
Figure 6:
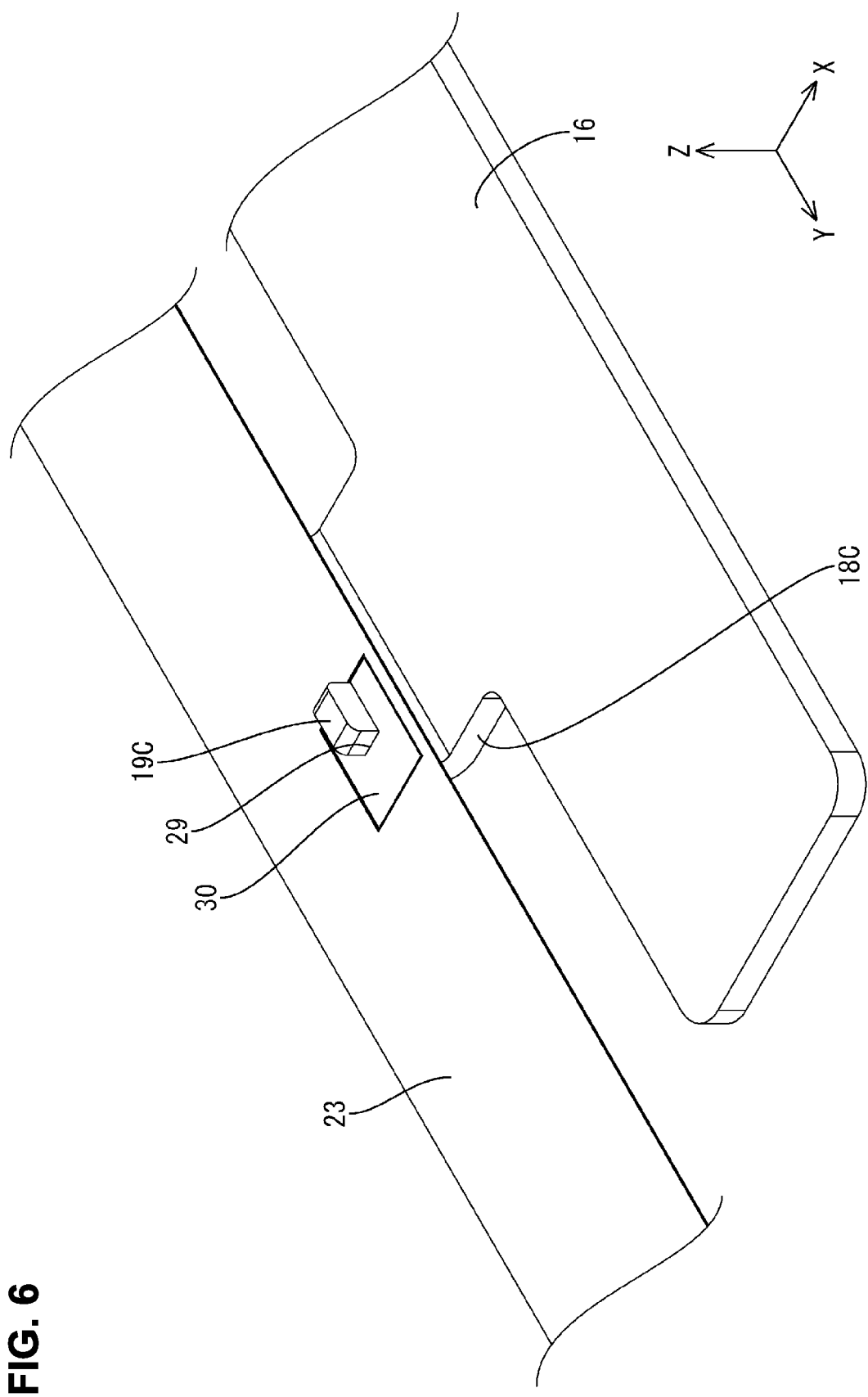
FIG. 6 is a partially enlarged perspective view showing a state in which a protruding portion of the third bus bar is inserted through a via hole.

The flexible printed circuit board 17 is formed by cutting the film 20 in which the conductive paths 21 have been formed into a predetermined shape using a known method such as Thomson die cutting. The flexible printed circuit board 17 according to the present embodiment has a shape elongated in the front-rear direction. As shown in FIG. 5, the flexible printed circuit board 17 includes a proximal end portion 22 provided in the front end portion, a left strip portion 23 (corresponding to one strip portion) that extends in the rear direction (an example of a first direction) from the rear end portion of the proximal end portion 22 and is located on the left side, and a right strip portion 24 (corresponding to the other strip portion) that extends in the rear direction from the rear end portion of the proximal end portion 22 and is located on the right side.

A portion of the plurality of conductive paths 21 is formed spanning from the proximal end portion 22 to the left strip portion 23. Also, another portion of the plurality of conductive paths 21 is formed spanning from the proximal end portion 22 to the right strip portion 24.

Proximal End Portion 22

Figure 7:
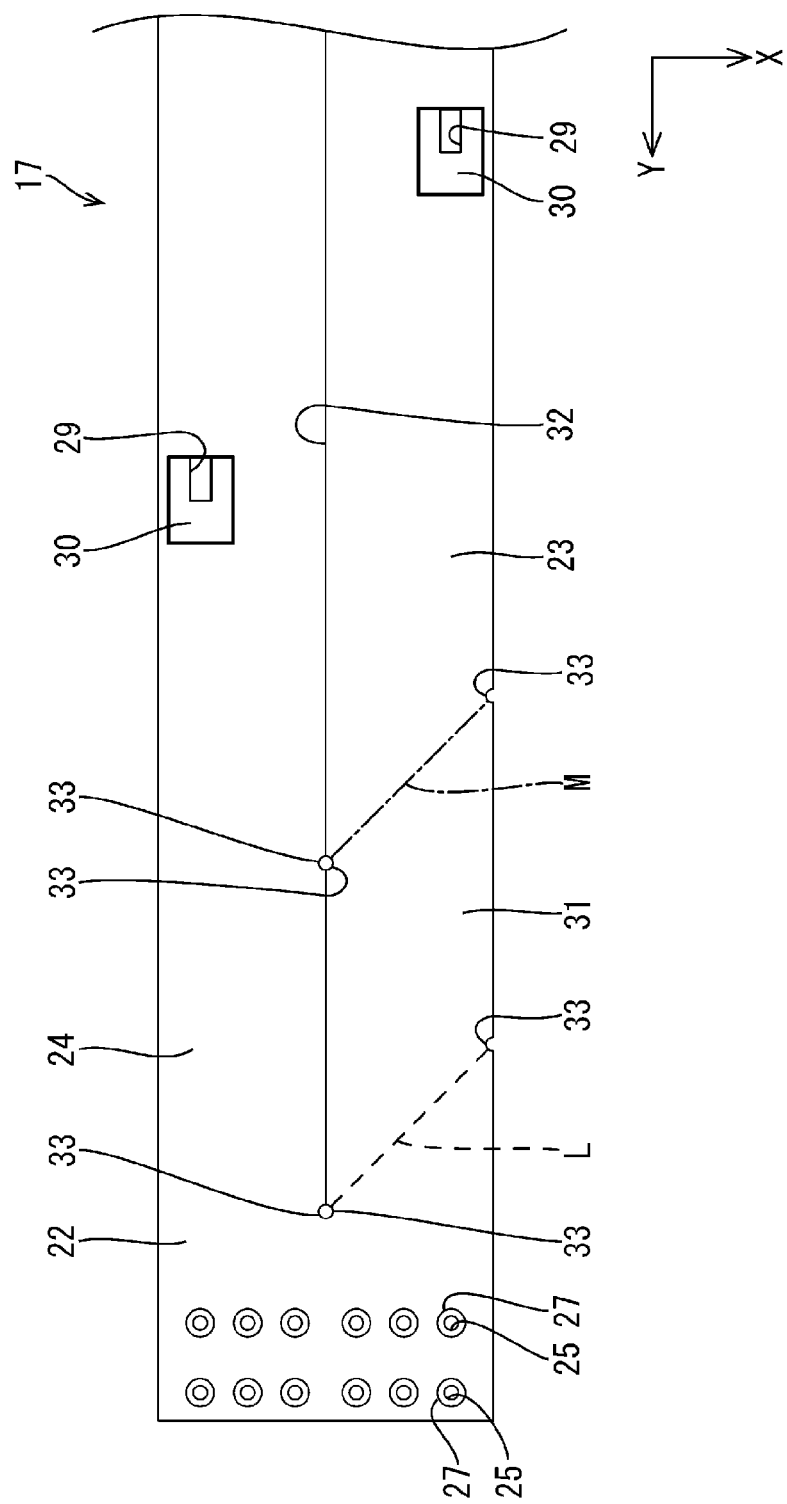
FIG. 7 is a partially enlarged plan view showing the flexible printed circuit board in a state in which the deformation portion is not bent.

As shown in FIGS. 7 and 8, in the proximal end portion 22 of the flexible printed circuit board 17, rows of through holes 25 are provided, each row including a plurality of (six in the present embodiment) through holes 25 arranged with a spacing therebetween in the left-right direction. The rows of through holes 25 are arranged with a spacing therebetween in the front-rear direction. Each through hole 25 extends through the proximal end portion 22 in the up-down direction. The through hole 25 has a circular cross-sectional shape. Around the hole edge portion of the through hole 25 on the upper surface of the proximal end portion 22, a proximal end-side connecting portion 27 that is connected to the corresponding conductive path 21 is formed. A connector terminal (not shown) is inserted through the through hole 25, and the connector terminal inserted through the through hole 25 is connected to the proximal end-side connecting portion 27 through soldering.

As shown in FIG. 2, a connector 28 is connected to the proximal end portion 22. In the connector 28, a plurality of connector terminals (not shown) are provided. One end portions of the connector terminals extend in the front direction in the connector 28, and the other end portions are bent downward and inserted through the through holes 25 formed in the proximal end portion 22, and are electrically connected to the proximal end-side connecting portions 27 in this state.

As shown in FIG. 5, the left strip portion 23 and the right strip portion 24 extend in parallel in the front-rear direction from the rear end portion of the proximal end portion 22. The left strip portion 23 and the right strip portion 24 are separated through cutting. The length dimension in the front-rear direction of the left strip portion 23 is set to be shorter than that of the right strip portion 24. The width dimension in the left-right direction of the left strip portion 23 is set to be substantially equal to that of the right strip portion 24. The sum of the width dimension in the left-right direction of the left strip portion 23 and that of the right strip portion 24 is equal to the width dimension in the left-right direction of the proximal end portion 22.

Left Strip Portion 23

At positions close to the left side edge of the left strip portion 23, a plurality of (three in the present embodiment) via holes 29 extending through the left strip portion 23 in the up-down direction are formed with a spacing therebetween in the front-rear direction. Each via hole 29 has an elongated rectangular cross-sectional shape extending in the front-rear direction. The hole edge portion of the via hole 29 is formed to have substantially the same size as the outer shape of the protruding portion 19 of the third bus bar 16. As used herein, the expression "substantially the same" encompasses the case where the hole edge portion of the via hole 29 has the same size as the outer shape of the protruding portion 19C of the third bus bar 16 and the case where the hole edge portion of the via hole 29 has a size that can be considered to be substantially the same as the outer shape of the protruding portion if the hole edge portion of the via hole 29 does not have exactly the same size as the outer shape of the protruding portion. With this configuration, the protruding portion 19C of the third bus bar 16 can be inserted through the via hole 29 of the left strip portion 23 in the up-down direction (see FIG. 6).

In the vicinity of the hole edge portion of each via hole 29 on the upper surface of the left strip portion 23, a strip side connecting portion 30 that is connected to the corresponding conductive path 21 is formed. The protruding portion 19 of the third bus bar 16 is inserted through the via hole 29, and the protruding portion 19 of the third bus bar 16 inserted through the via hole 29 is connected to the strip side connecting portion 30 through soldering. With this configuration, the strip side connecting portion 30 of the left strip portion 23 is electrically connected to the electrode terminals 13 of the electricity storage devices 10 via the third bus bar 16. The three third bus bars 16 are spaced apart in the front-rear direction and connected to the strip side connecting portions 30 that are provided in the left strip portion 23.

Right Strip Portion 24

At positions close to the right side edge of the right strip portion 24, a plurality of (four in the present embodiment) via holes 29 extending through the right strip portion 24 in the up-down direction are formed with a spacing therebetween in the front-rear direction. Each via hole 29 has an elongated rectangular cross-sectional shape extending in the front-rear direction. The hole edge portion of the via hole 29 is formed to have substantially the same size as the outer shape of the protruding portion 19A of the first bus bar 14 and the protruding portion 19B of the second bus bar 15. As used herein, the expression "substantially the same" encompasses the case where the hole edge portion of the via hole 29 has the same size as the outer shape of the protruding portion 19A of the first bus bar 14 and the outer shape of the protruding portion 19B of the second bus bar 15 and the case where the hole edge portion of the via hole 29 has a size that can be considered to be substantially the same as the outer shapes of the protruding portions if the hole edge portion of the via hole 29 does not have exactly the same size as the outer shapes of the protruding portions. With this configuration, the protruding portion 19A of the first bus bar 14 and the protruding portion 19B of the second bus bar 15 can be inserted through the via holes 29 of the right strip portion 24 in the up-down direction.

In the vicinity of the hole edge portion of each via hole 29 on the upper surface of the right strip portion 24, a strip side connecting portion 30 that is connected to the corresponding conductive path 21 is formed. The protruding portion 19A of the first bus bar 14 and the protruding portion 19B of the second bus bar 15 are inserted through the via holes 29, and the protruding portion 19A of the first bus bar 14 and the protruding portion 19B of the second bus bar 15 inserted through the via holes 29 are connected to the strip side connecting portions 30 through soldering. With this configuration, a portion of the strip side connecting portions 30 of the right strip portion 24 is electrically connected to the electrode terminals 13 of the electricity storage devices 10 via the first bus bar 14. Also, another portion of the strip side connecting portions 30 of the right strip portion 24 is electrically connected to the electrode terminals 13 of the electricity storage devices 10 via the second bus bar 15.

Figure 10:
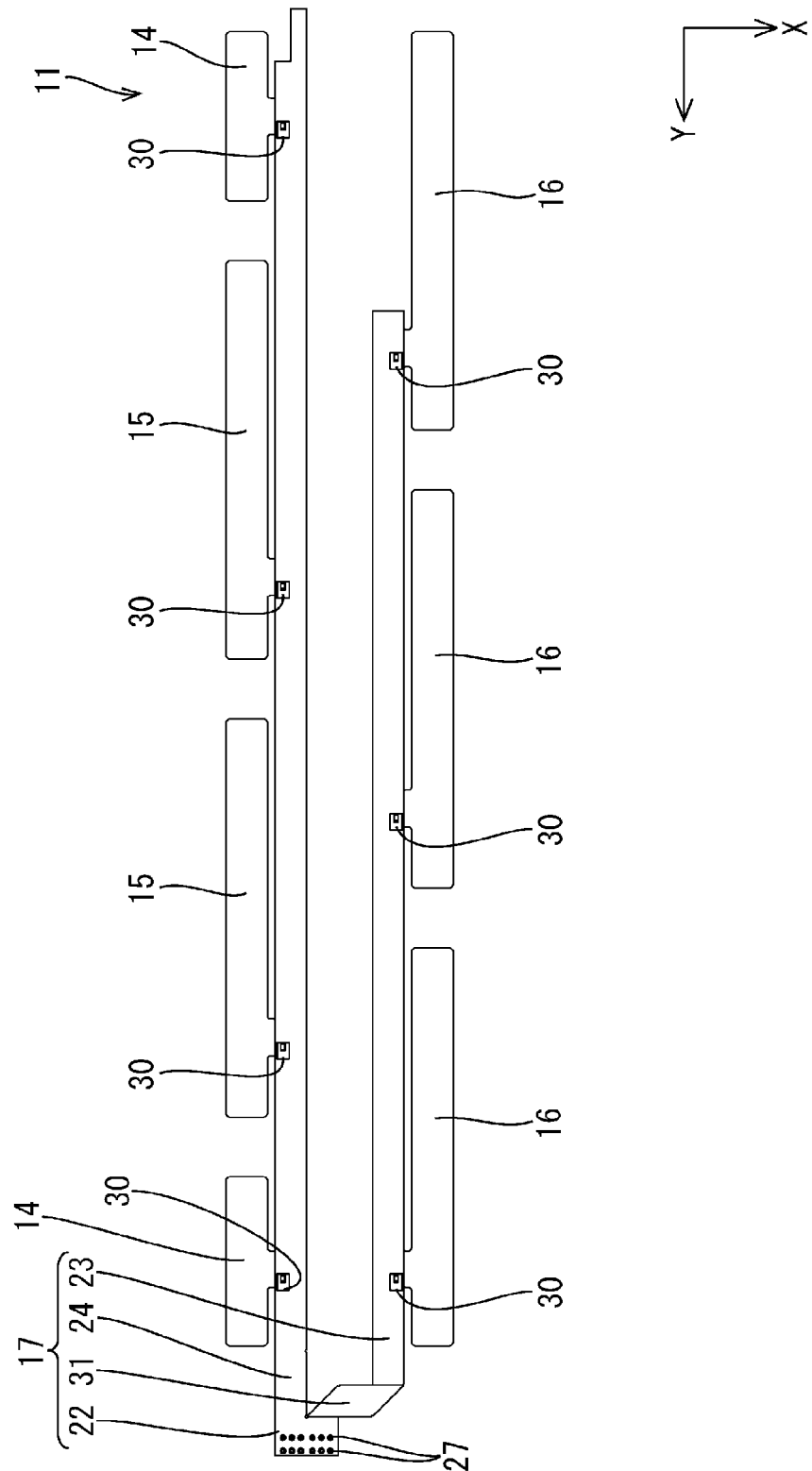
FIG. 10 is a plan view showing a wiring module.

As shown in FIG. 10, the strip side connecting portion 30 provided at a position close to the front end portion of the right strip portion 24 and the strip side connecting portion 30 provided at a position close to the rear end portion of the same are connected to the first bus bars 14. Out of the strip side connecting portions 30 of the right strip portion 24, the second strip side connecting portion 30 and the third strip side connecting portion 30 from the front are connected to the second bus bars 15. Accordingly, in the right strip portion 24, the first bus bars 14 and the second bus bars 15 are spaced apart in the front-rear direction.

Deformation Portion 31

As shown in FIGS. 5 and 7, the left strip portion 23 and the right strip portion 24 are separated in the left-right direction by a separation slit 32 that extends in the front-rear direction. The separation slit 32 is formed when the flexible printed circuit board 17 is cut.

As shown in FIG. 7, a via hole that has a diameter larger than the width dimension in the left-right direction of the separation slit 32 is formed in the front end portion of the separation slit 32 so as to extend through the flexible printed circuit board 17 in the up-down direction. Accordingly, in the front end portion of the right side edge of the left strip portion 23, a notch portion 33 that has a semicircular shape and is recessed toward the left when viewed from above is formed. Likewise, in the front end portion of the left side edge of the right strip portion 24, a notch portion 33 that has a semicircular shape and is recessed toward the right when viewed from above is formed.

At a position that is located slightly rearward from the front end portion of the separation slit 32 and is located on the front side of the strip side connecting portion 30 provided at the foremost position in the right strip portion 24, a via hole that has a diameter larger than the width dimension in the left-right direction of the separation slit 32 is formed so as to extend through the flexible printed circuit board 17 in the up-down direction. Accordingly, in the right side edge of the left strip portion 23, a notch portion 33 that has a semicircular shape and is recessed toward the left when viewed from above is formed. Likewise, in the left side edge of the right strip portion 24, a notch portion 33 that has a semicircular shape and is recessed toward the right when viewed from above is formed.

In the left side edge of the left strip portion 23, two notch portions 33 are formed in a spaced apart manner in the front-rear direction. Each of the two notch portions 33 has a semicircular shape when viewed from above. The front notch portion 33 is formed between the two notch portions 33 that are formed in the right side edge of the left strip portion 23 in the front-rear direction. The rear notch portion 33 is formed, in the front-rear direction, at a position that is located on the rear side of the rear notch portion 33 formed in the right side edge of the left strip portion 23 and is located on the front side of the strip side connecting portion 30 provided at the foremost position in the right strip portion 24.

The left strip portion 23 is valley folded along an imaginary line L that connects the front notch portion 33 formed in the right side edge of the left strip portion 23 and the front notch portion 33 formed in the left side edge of the left strip portion 23, and the left strip portion 23 is mountain folded along an imaginary line M that connects the rear notch portion 33 formed in the right side edge of the left strip portion 23 and the rear notch portion 33 formed in the left side edge of the left strip portion 23. As a result, the left strip portion 23 and the right strip portion 24 are separated from each other in the left-right direction (see FIG. 8). The angle formed by the left side edge of the left strip portion 23 and the imaginary line L that connects the front notch portion 33 formed in the right side edge of the left strip portion 23 and the front notch portion 33 formed in the left side edge of the left strip portion 23 is set to substantially 45°. Likewise, the angle formed by the left side edge of the left strip portion 23 and the imaginary line M that connects the rear notch portion 33 formed in the right side edge of the left strip portion 23 and the rear notch portion 33 formed in the left side edge of the left strip portion 23 is also set to substantially 45°. As used herein, the term "substantially 45°" encompasses an angle of 45° and an angle that is considered to be substantially 45° if the angle is not exactly 45°.

In the left strip portion 23, a region extending in the front-rear direction between the front notch portion 33 formed in the right side edge and the rear notch portion 33 formed in the left side edge is defined as a deformation portion 31. As a result of the deformation portion 31 of the left strip portion 23 being bent, the left strip portion 23 and the right strip portion 24 extend in the front-rear direction, with the left strip portion 23 and the right strip portion 24 being separated from each other in the left-right direction.

Example of Production Process of Embodiment

Next, an example of a production process for producing the wiring module 11 according to the present embodiment will be described. The production process is not limited to the description given below.

Conductive paths 21 are formed in a film 20 made of insulating synthetic resin using printed circuit board technology. Holes are formed at predetermined locations. The film 20 is cut using, for example, Thomson die cutting (not shown). In this way, a flexible printed circuit board 17 that has a shape as shown in FIG. 5 is formed. Forming of the holes and cutting of the film may be performed in any order.

Figure 9:
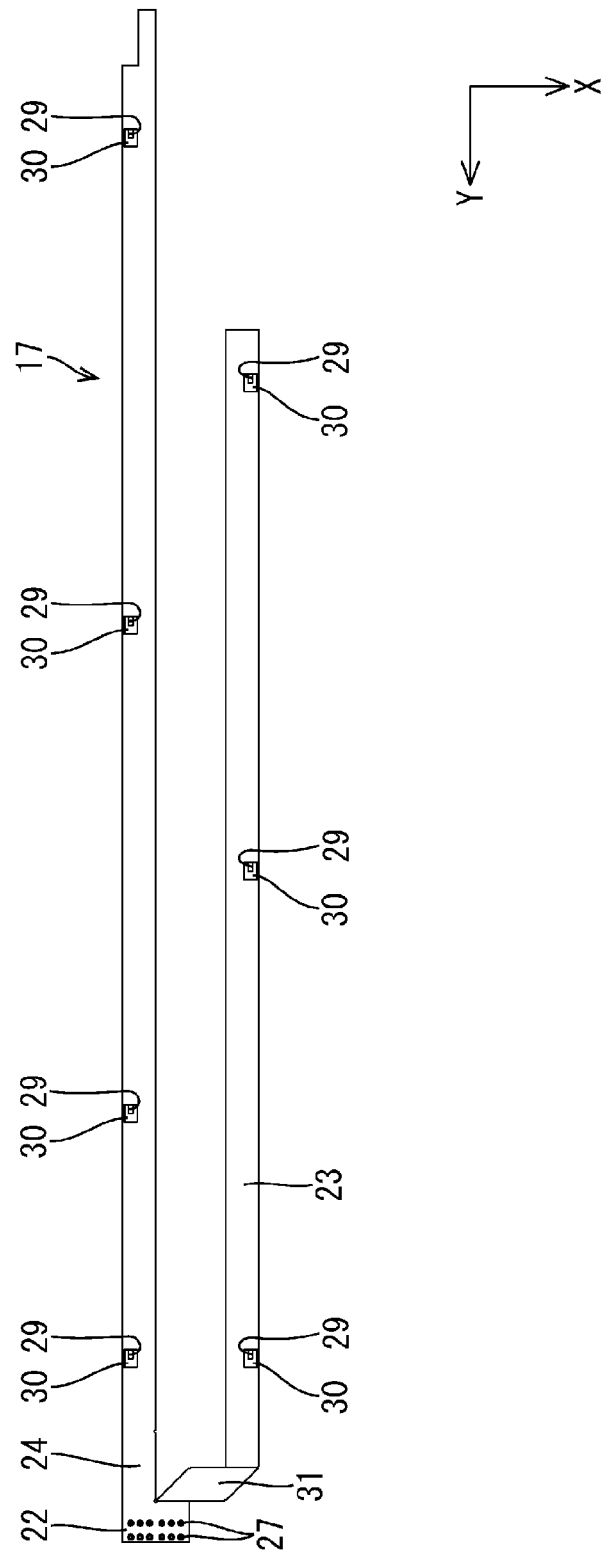
FIG. 9 is a plan view showing the flexible printed circuit board in a state in which the deformation portion is bent.

The left strip portion 23 of the flexible printed circuit board 17 formed in a predetermined shape is subjected to bending. As a result, as shown in FIG. 9, the left strip portion 23 and the right strip portion 24 are separated from each other in the left-right direction.

In a jig (not shown), first bus bars 14, second bus bars 15, and third bus bars 16 are disposed such that protruding portions 19 face upward. In a state in which the protruding portions 19 are positioned to match the via holes 29 that are formed in the flexible printed circuit board 17, an attaching step of attaching the flexible printed circuit board 17, from above, to the first bus bars 14, the second bus bars 15, and the third bus bars 16 is performed. A soldering step of soldering the strip side connecting portions 30 and the protruding portions 19 is performed (see FIG. 10). A connector 28 is connected to the proximal end portion 22. In this way, a wiring module 11 is produced.

The wiring module 11 attached to the jig is assembled, from above, with a plurality of electricity storage devices 10 that are arranged in the front-rear direction. A connecting step of connecting the first bus bars 14, the second bus bars 15, and the third bus bars 16 to the electrode terminals 13 using laser welding or soldering is performed. In this way, an electricity storage module 12 is produced (see FIG. 2). The order in which the attaching step, the soldering step, and the connecting step are performed is not limited to the order described above.

Advantageous Effects of Embodiment

Next, advantageous effects of the present embodiment will be described. The flexible printed circuit board 17 according to the present embodiment includes a proximal end portion 22, a left strip portion 23 and a right strip portion 24 that extend in the rear direction from the proximal end portion 22, and conductive paths 21, a portion of which is provided spanning from the proximal end portion 22 to the left strip portion 23, and another portion of which is provided spanning from the proximal end portion 22 to the right strip portion 24. Strip side connecting portions 30 that are electrically connected to electrode terminals 13 of electricity storage devices 10 are formed at portions of the conductive paths 21 in the left strip portion 23 and the right strip portion 24. A deformation portion 31 that deforms to increase the distance between the left strip portion 23 and the right strip portion 24 is provided in the left strip portion 23.

Also, the wiring module 11 according to the present embodiment is a wiring module 11 including the flexible printed circuit board 17, and a first bus bar 14, a second bus bar 15, and a third bus bar 16 that are connected to electrode terminals 13 of a plurality of electricity storage devices 10 that have the electrode terminals 13 and are also connected to the strip side connecting portions 30, wherein the first bus bar 14, the second bus bar 15, and the third bus bar 16 are spaced apart in the first direction and connected to the strip side connecting portions 30 provided in the left strip portion 23 and the right strip portion 24 of the flexible printed circuit board 17.

With the configuration described above, the wiring module 11 can be formed using one flexible printed circuit board 17, and thus the number of components can be reduced. Consequently, the production cost can be reduced.

Also, because the proximal end portion 22 and the conductive paths 21 spanning from the proximal end portion 22 to each of the left strip portion 23 and the right strip portion 24 are formed, there is no need to provide a wasted space in which a conductive path 21 is not formed in a region between the left strip portion 23 and the right strip portion 24. Accordingly, the production cost can be reduced.

Also, with the configuration described above, by changing the degree of deformation of the deformation portion 31, the distance between the left strip portion 23 and the right strip portion 24 can be changed as appropriate. Thus, even if the interval between electrode terminals 13 is different, by changing the degree of deformation of the deformation portion 31, this problem can be easily dealt with by simply using the flexible printed circuit board 17 that has one shape. As a result, the production cost can be reduced as compared with the case where flexible printed circuit boards 17 are formed individually according to the interval between electrode terminals 13.

Also, according to the present embodiment, proximal end-side connecting portions 27 that are connected to a connector 28 are provided at portions of the conductive paths 21 in the proximal end portion 22.

With the configuration described above, the number of components can be reduced as compared with the case where the connector 28 is provided in each of the left strip portion 23 and the right strip portion 24, and thus the production cost can be reduced.

Also, according to the present embodiment, the distance between the left strip portion 23 and the other strip portion can be increased as a result of the deformation portion 31 being bent.

With the configuration described above, with a simple method of bending the deformation portion 31, the distance between the left strip portion 23 and the right strip portion 24 can be increased, and it is therefore possible to suppress an increase in the production cost.

Also, according to the present embodiment, notch portions 33 are formed in the left side edge and the right side edge of the left strip portion 23, and the deformation portion 31 is bent at the notch portions 33.

With the configuration described above, a worker can easily bend the strip portion when bending the deformation portion 31, and it is therefore possible to improve the efficiency of bending the deformation portion 31.

Embodiment 2

Figure 11:
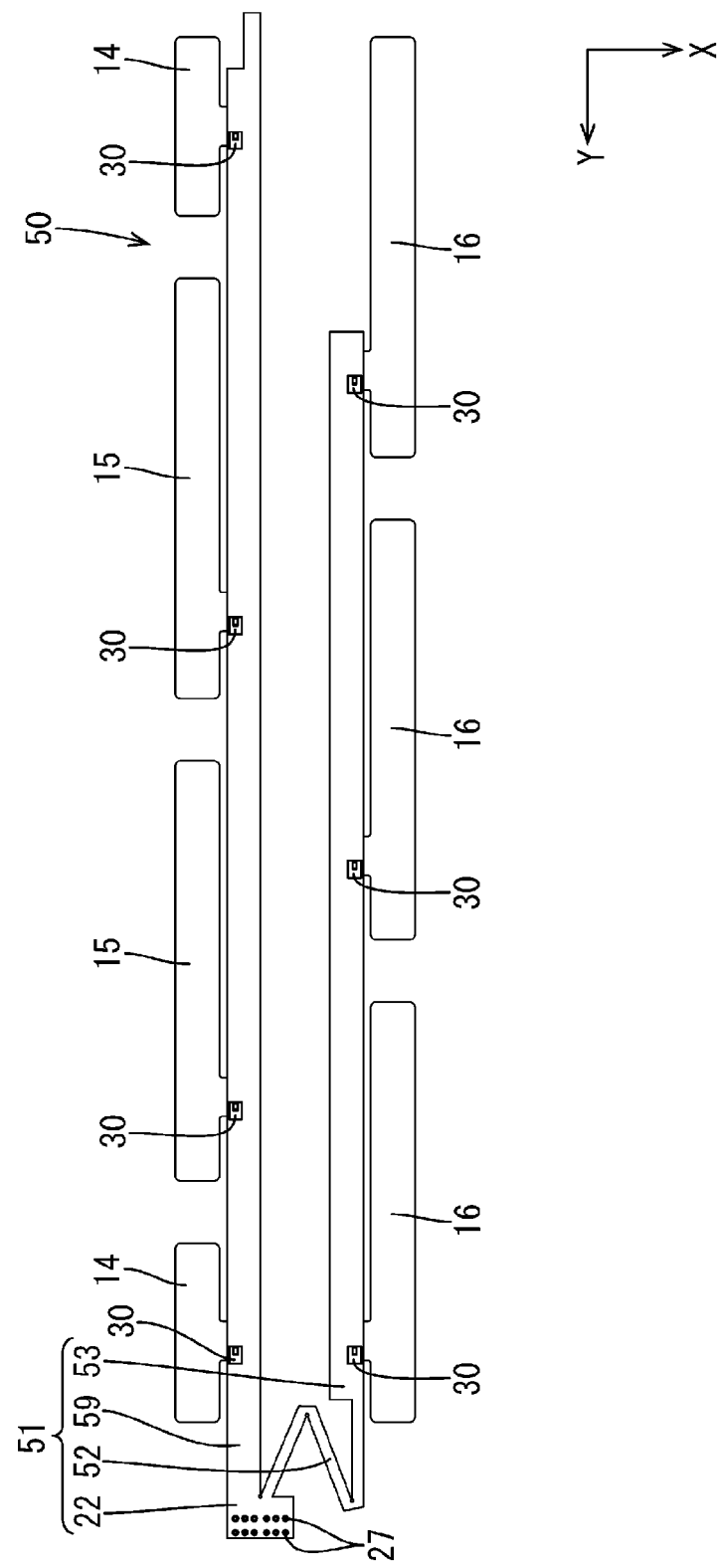
FIG. 11 is a plan view showing a wiring module according to Embodiment 2.

Next, Embodiment 2 of the technique disclosed in the specification of the present application will be described with reference to FIGS. 11 to 14. As shown in FIG. 11, a flexible printed circuit board 51 used in a wiring module 50 according to the present embodiment is different from that of Embodiment 1 in that a deformation portion 52 has a different structure.

Figure 12:
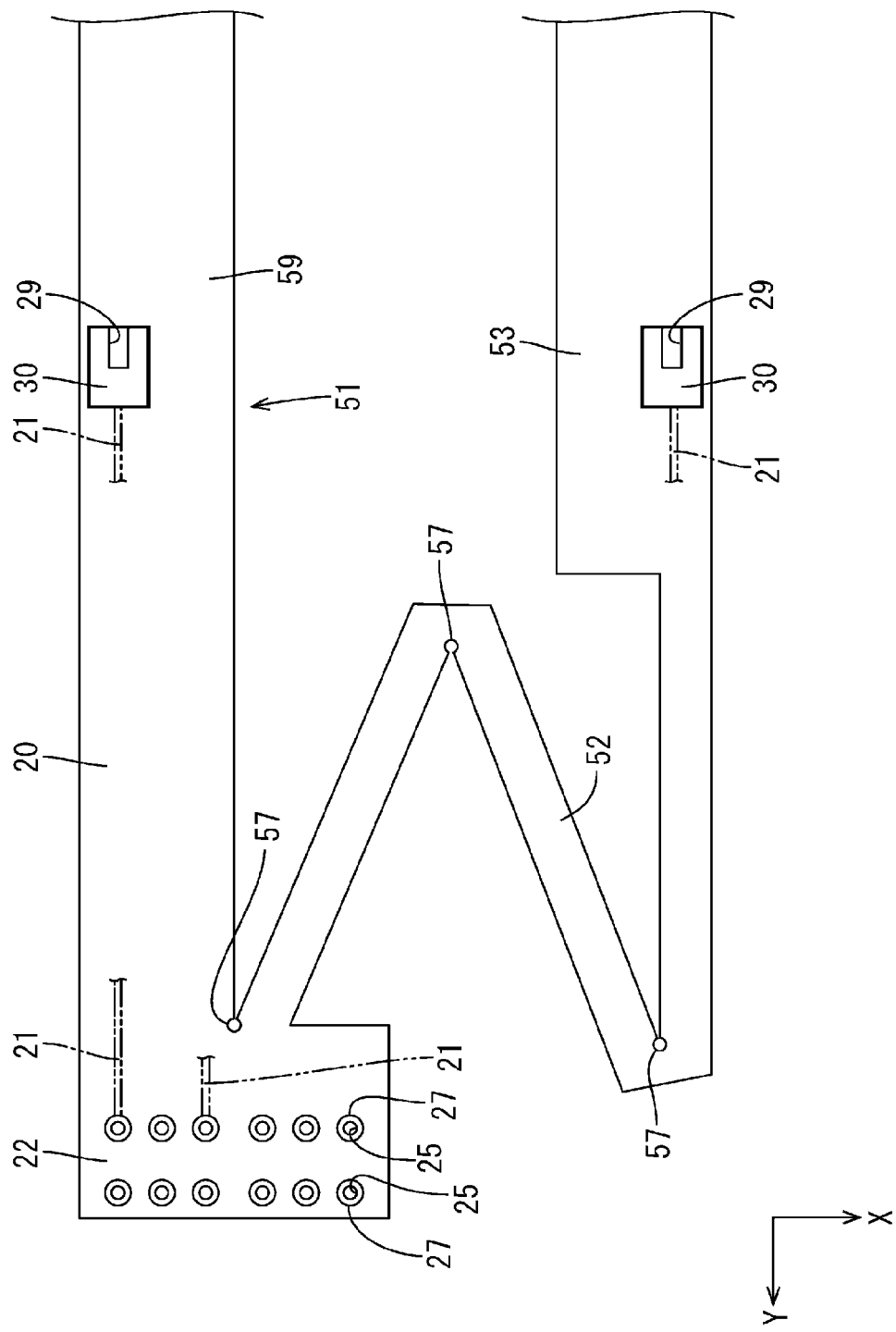
FIG. 12 is a partially enlarged plan view showing a flexible printed circuit board in a state in which a deformation portion is deformed.

As shown in FIG. 12, a via hole 57 extending through the flexible printed circuit board 51 in the up-down direction is formed in the front end portion of the right side edge of a left strip portion 53. The via hole 57 has a circular shape when viewed from above. The diameter of the via hole 57 is set to be larger than the width dimension in the left-right direction of the separation slit 32.

Figure 13:
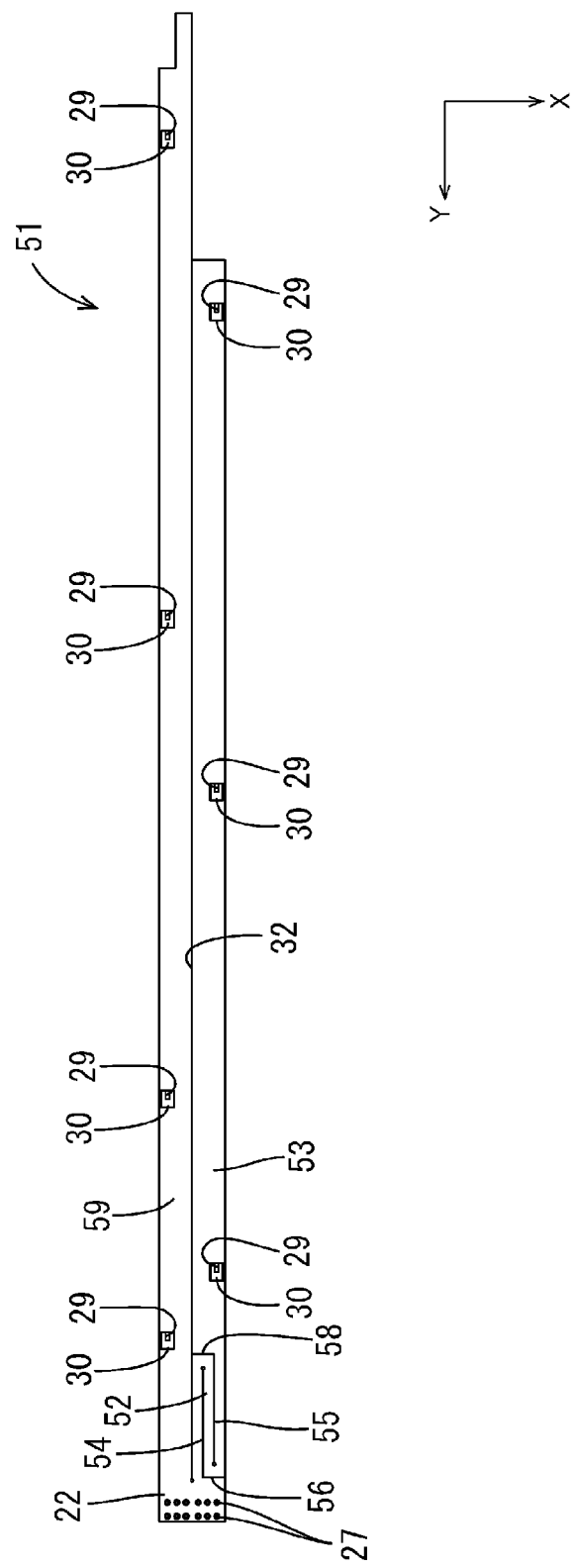
FIG. 13 is a plan view showing the flexible printed circuit board in a state in which the deformation portion is not deformed.

As shown in FIG. 13, at a position that is close to the front end portion of the left strip portion 53, a right-side slit 54 (an example of a slit) that extends in the front-rear direction and a left-side slit 55 (an example of a slit) that is located on the left side of the right-side slit 54 are formed. The portion that is close to the front end portion of the left strip portion 53 is divided into three substantially equal parts in the left-right direction by the right-side slit 54 and the left-side slit 55.

Right-Side Slit 54

The front end portion of the right-side slit 54 is located slightly rearward from the front end portion of the left strip portion 53. The rear end portion of the right-side slit 54 is located slightly forward of the foremost strip side connecting portion 30 formed in a right strip portion 59.

In the left strip portion 53, a front communication slit 56 that extends in the left direction from the front end portion of the right-side slit 54 to the left side edge of the left strip portion 53 is formed. In the rear end portion of the right-side slit 54, a via hole 57 that extends through the left strip portion 53 in the up-down direction is formed. The hole edge portion of the via hole 57 has a circular shape when viewed from above. The diameter of the via hole 57 is set to be larger than the width dimension in the left-right direction of the right-side slit 54 in a state in which the right-side slit 54 is not widened.

Left-Side Slit 55

The front end portion of the left-side slit 55 is located slightly rearward from the front communication slit 56. The rear end portion of the left-side slit 55 is located slightly rearward from the rear end portion of the right-side slit 54.

In the front end portion of the left-side slit 55, a via hole 57 that extends through the left strip portion 53 in the up-down direction is formed. The hole edge portion of the via hole 57 has a circular shape when viewed from above. The diameter of the via hole 57 is set to be larger than the width dimension in the left-right direction of the left-side slit 55 in a state in which the left-side slit 55 is not widened. In the left strip portion 53, a rear communication slit 58 that extends in the right direction from the rear end portion of the left-side slit 55 to the right side edge of the left strip portion 53 is formed.

In the present embodiment, a region extending from the front end portion of the left strip portion 53 to the rear communication slit 58 in the front-rear direction is defined as a deformation portion 52. As shown in FIGS. 12 and 14, the distance between the right strip portion 59 and the left strip portion 53 is increased as a result of the right-side slit 54 and the left-side slit 55 being widened in the left-right direction.

Embodiment 2 is substantially the same as Embodiment 1 except for the configuration described above, and thus the same members are given the same reference numerals, and a redundant description will be omitted.

According to the present embodiment, the right-side slit 54 and the left-side slit 55 that extend in the first direction are formed in the left strip portion 53, and as a result of the left strip portion 53 being deformed to widen the right-side slit 54 and the left-side slit 55, the distance between the left strip portion 53 and the right strip portion 59 is increased.

With the configuration described above, with a simple method of deforming the left strip portion 53 to widen the right-side slit 54 and the left-side slit 55, the distance between the left strip portion 53 and the right strip portion 59 can be increased, and it is therefore possible to suppress an increase in the production cost.

Also, according to the present embodiment, the via hole 57 with a diameter larger than the width dimension of the right-side slit 54 is formed in the rear end portion of the right-side slit 54, and the via hole 57 with a diameter larger than the width dimension of the left-side slit 55 is formed in the front end portion of the left-side slit 55.

With the configuration described above, due to the via holes 57, the right-side slit 54 and the left-side slit 55 can be easily deformed, and it is therefore possible to improve the working efficiency of deforming the deformation portion 52 to be spaced apart.

Other Embodiments

The technique disclosed in the specification of the present application is not limited to the embodiments described above with reference to the drawings, and, for example, embodiments given below are also encompassed within the technical scope of the technique disclosed in the specification of the present application.

(1) In the embodiments of the present application, a configuration is used in which the deformation portions 31 and 52 are provided only in the left strip portions 23 and 53, but the configuration is not limited thereto, and the deformation portions 31 and 52 may be provided in both of the left strip portions 23 and 53 and the right strip portions 24 and 59.

(2) In the embodiments of the present application, a configuration is used in which the strip side connecting portions 30 are formed around the hole edge portion of each via hole 29, but the via holes 29 may be omitted. In this case, the bus bars may be reflow-soldered to lands that are provided on the flexible printed circuit board 17.

(3) In the embodiments of the present application, a configuration is used in which the proximal end-side connecting portions 27 are formed around the hole edge portion of each through hole 25, but the through holes 25 may be omitted. In this case, the terminals of the connector 28 may be reflow soldered to lands that are provided on the flexible printed circuit board 17. Alternatively, the terminals of the connector 28 and the lands may be electrically connected by providing a pair of deformable arm portions to each terminal of the connector 28 and sandwiching a land between the pair of deformable arm portions.

(4) In the embodiments of the present application, a configuration is used in which the first bus bar 14, the second bus bar 15, and the third bus bar 16 that are connected to the plurality of electrode terminals 13 to connect the plurality of electricity storage devices 10 in parallel or in series are used as the conductive members, but the configuration is not limited thereto. A voltage detection terminal that is connected to one electrode terminal 13 and detects the voltage of the electrode terminal 13 may be used.

(5) In the embodiments of the present application, a configuration is used in which sets of electricity storage devices 10, each including three adjacent electricity storage devices 10 that are connected in parallel, are connected in series, but the configuration is not limited thereto. The number of electricity storage devices 10 connected in parallel may be two, or may be four or more. Also, all of the plurality of electricity storage devices 10 may be connected in series.

(6) In Embodiment 1, a configuration is used in which the deformation portion 31 is bent at two locations so as to separate the left strip portion 23 and the right strip portion 24 from each other, but the number of locations at which the deformation portion 31 is bent is not limited. Also, in the deformation portion 31, the portion to be mountain folded and the portion to be valley folded can be selected as appropriate and necessary.

(7) In Embodiment 1, a configuration is used in which the notch portions 33 are configured to have a circular shape or a semicircular shape when viewed from above, but the configuration is not limited thereto, and the notch portions 33 may have, when viewed from above, a polygonal shape such as a triangular shape or a rectangular shape, or an elliptical shape, or any shape. Also, the notch portions 33 may be omitted.

(8) In Embodiment 2, a configuration is used in which the right-side slit 54 and the left-side slit 55 that extend in the front-rear direction are formed, but the number of slits may be one, or may be three or more.

(9) In Embodiment 2, a configuration is used in which the via holes 57 are configured to have a circular shape when viewed from above, but the configuration is not limited thereto, and the via holes 57 may have, when viewed from above, a polygonal shape such as a triangular shape or a rectangular shape, or an elliptical shape, or any shape. Also, the via holes 57 may be omitted.

(10) The electricity storage devices 10 may be secondary batteries such as lithium ion batteries or nickel metal hydride batteries, or may be capacitors.

LIST OF REFERENCE NUMERALS 10 electricity storage device
11, 50 wiring module
13 electrode terminal
17, 51 flexible printed circuit board
21 conductive path
22 proximal end portion
23, 53 left strip portion
24, 59 right strip portion
27 proximal end-side connecting portion
28 connector
30 strip side connecting portion
31, 52 deformation portion
33 notch portion
54 right-side slit
55 left-side slit
57 via hole

The invention claimed is:

1. A flexible printed circuit board comprising:
a quadrilateral proximal end portion including a front edge connected to a connector and a rear edge spaced from the front edge in a first direction;
first and second strip portions, each extending in the first direction from the rear edge of the proximal end portion, the rear edge extending in a direction perpendicular to the first direction; and
conductive paths that are provided spanning from the proximal end portion to each of the first and second strip portions, the conductive paths including strip side connecting portions that are electrically connected to electrode terminals of electricity storage devices at portions of the conductive paths in the first and second strip portions,
wherein, at least in the first strip portion of the first and second strip portions, a deformation portion is provided that deforms to increase a distance between the first strip portion and the second strip portion in a second direction that intersects the first direction, the deformation portion being spaced from the connector in the first direction,
wherein the distance between the first strip portion and the second strip portion in the second direction is increased as a result of the deformation portion being folded twice such that the deformation portion extends in the second direction and the first strip portion extends in the first direction from an end of the deformation portion to a distal end of the first strip portion,
wherein strip side through holes are provided in the first and second strip portions, a conductive member to electrically connect each strip side connecting portion to an electrode terminal of the electricity storage devices is inserted into each of the strip side through holes, and each strip side connecting portion is provided to surround one of the strip side through holes.

2. The flexible printed circuit board according to claim 1, wherein proximal end-side connecting portions that are connected to the connector are provided at portions of the conductive paths in the proximal end portion.

3. The flexible printed circuit board according to claim 1, wherein a notch portion is provided in at least one side edge of the first strip portion that includes the deformation portion, and the deformation portion is folded at the notch portion.

4. A wiring module comprising:
the flexible printed circuit board according to claim 1; and
a plurality of conductive members that are connected to the electrode terminals of the electricity storage devices that include the electrode terminals, and are connected to the strip side connecting portions,
wherein the plurality of conductive members are spaced apart in the first direction and connected to the strip side connecting portions provided in the first and second strip portions of the flexible printed circuit board.

5. The flexible printed circuit board according to claim 1, wherein
the first strip portion is valley folded along a first imaginary line that extends between a first point and a second point, and is mountain folded along a second imaginary line that extends between a third point and a fourth point,
the first point is provided in a first longitudinal edge of the first strip portion at a front end of the first strip portion at which the first strip portion connects the proximal end portion, and the second point is provided in a second longitudinal edge of the first strip portion and farther from the proximal end portion than the first point in the first direction,
the third point is provided in the first longitudinal edge of the first strip portion and farther from the proximal end portion than the second point in the first direction, and the fourth point is provided in the second longitudinal edge of the first strip portion and farther from the proximal end portion than the third point in the first direction.

6. The flexible printed circuit board according to claim 5, wherein
an angle between the first longitudinal edge of the first strip portion and the first imaginary line is set to substantially 45°, and
an angle between the first longitudinal edge of the first strip portion and the second imaginary line is set to substantially 45°.

7. The flexible printed circuit board according to claim 1, wherein
a sum of a width of the first strip portion and a width of the second strip portion is equal to a width of the proximal end portion.

8. A flexible printed circuit board comprising:
a proximal end portion;
first and second strip portions, each extending in a first direction from the proximal end portion; and
conductive paths that are provided spanning from the proximal end portion to each of the first and second strip portions, the conductive paths including strip side connecting portions that are electrically connected to electrode terminals of electricity storage devices at portions of the conductive paths in the first and second strip portions,
wherein, at least in the first strip portion of the first and second strip portions, a deformation portion is provided that deforms to increase a distance between the first strip portion and the second strip portion in a second direction that intersects the first direction,
the deformation portion of the first strip portion includes at least one L-shaped slit including a longitudinally extending slit portion that extends in the first direction and a transversely extending slit portion that extends from a first end of the longitudinally extending slit portion to a longitudinal edge of the first strip portion, and the distance between the first strip portion and the second strip portion in the second direction is increased as a result of the deformation portion being deformed to widen the at least one L-shaped slit in the second direction,
the at least one L-shaped slit comprises a first L-shaped slit and a second L-shaped slit,
the first L-shaped slit includes a first longitudinally extending slit portion that extends in the first direction and a first transversely extending slit portion that extends from a front end of the first longitudinally extending slit portion to a first longitudinal edge of the first strip portion,
the second L-shaped slit includes a second longitudinally extending slit portion that extends in the first direction and a second transversely extending slit portion that extends from a rear end of the second longitudinally extending slit portion to a second longitudinal edge of the first strip portion,
the second longitudinally extending slit portion is provided between the first longitudinally extending slit portion and the first longitudinal edge of the first strip portion in a width direction of the first strip portion, and
the first strip portion is divided into three substantially equal parts in the width direction of the first strip portion by the first longitudinally extending slit portion and the second longitudinally extending slit portion.

9. The flexible printed circuit board according to claim 8, wherein a via hole that has a diameter larger than a width dimension of the longitudinally extending portion of the at least one L-shaped slit is provided at a second end of the longitudinally extending slit portion of the at least one L-shaped slit in the first direction.

10. The flexible printed circuit board according to claim 8, wherein
a front end of the second longitudinally extending slit portion is located rearward from the first transversely extending slit portion, and
the rear end of the second longitudinally extending slit portion is located rearward from the rear end the first longitudinally extending slit portion.

11. A flexible printed circuit board comprising:
a proximal end portion;
first and second strip portions, each extending in a first direction from the proximal end portion; and
conductive paths that are provided spanning from the proximal end portion to each of the first and second strip portions, the conductive paths including strip side connecting portions that are electrically connected to electrode terminals of electricity storage devices at portions of the conductive paths in the first and second strip portions,
wherein, at least in the first strip portion of the first and second strip portions, a deformation portion is provided that deforms to increase a distance between the first strip portion and the second strip portion in a second direction that intersects the first direction,
the deformation portion of the first strip portion includes at least one L-shaped slit including a longitudinally extending slit portion that extends in the first direction and a transversely extending slit portion that extends from a first end of the longitudinally extending slit portion to a longitudinal edge of the first strip portion, and the distance between the first strip portion and the second strip portion in the second direction is increased as a result of the deformation portion being deformed to widen the at least one L-shaped slit in the second direction, the at least one L-shaped slit comprises a first L-shaped slit and a second L-shaped slit, the first L-shaped slit includes a first longitudinally extending slit portion that extends in the first direction and a first transversely extending slit portion that extends from a front end of the first longitudinally extending slit portion to a first longitudinal edge of the first strip portion, the second L-shaped slit includes a second longitudinally extending slit portion that extends in the first direction and a second transversely extending slit portion that extends from a rear end of the second longitudinally extending slit portion to a second longitudinal edge of the first strip portion, the front end of the first longitudinally extending slit portion is located rearward from a front end of the first strip portion, and a rear end of the first longitudinally extending slit portion is located forward from a foremost strip side connecting portion, of the strip side connecting portions, provided in the second strip portion.

\* \* \* \* \*